US006148085A

United States Patent [19]

Jung

[11] Patent Number: 6,148,085

[45] Date of Patent: Nov. 14, 2000

[54] AUDIO SIGNAL OUTPUT APPARATUS FOR SIMULTANEOUSLY OUTPUTTING A PLURALITY OF DIFFERENT AUDIO SIGNALS CONTAINED IN MULTIPLEXED AUDIO SIGNAL VIA LOUDSPEAKER AND HEADPHONE

[75] Inventor: Chang-Joo Jung, Suwon, Rep. of Korea

[73] Assignee: Samsung Electronics Co., Ltd., Kyungki-Do, Rep. of Korea

[21] Appl. No.: 09/143,576

[22] Filed: Aug. 28, 1998

[30] Foreign Application Priority Data

Aug. 29, 1997 [KR] Rep. of Korea .................... 97-42418

[51] Int. Cl.[7] .............................. H03G 3/00; H02B 1/00

[52] U.S. Cl. ............................ 381/104; 381/74; 107/74; 107/107; 107/109; 107/123

[58] Field of Search .................................. 381/102, 104, 381/105, 106, 107, 109, 123, 74, 10, 57, 120, 119, 124

[56] References Cited

U.S. PATENT DOCUMENTS

| | | | |
|---|---|---|---|
| 4,881,123 | 11/1989 | Chapple | 381/104 |
| 5,369,711 | 11/1994 | Williamson, III | 381/104 |
| 5,692,058 | 11/1997 | Eggers et al. | 381/123 |
| 5,883,963 | 3/1999 | Tonella | 381/109 |
| 5,910,996 | 6/1999 | Eggers et al. | 381/107 |
| 5,995,633 | 11/1999 | Capples et al. | 381/123 |
| 6,072,367 | 6/2000 | Mase | 381/107 |

FOREIGN PATENT DOCUMENTS

| | | | |
|---|---|---|---|
| 6-113390 | 4/1994 | Japan | 381/123 |

*Primary Examiner*—Forester W. Isen
*Assistant Examiner*—Xu Mei
*Attorney, Agent, or Firm*—Sughrue, Mion, Zinn, Macpeak & Seas, PLLC

[57] ABSTRACT

An audio signal output apparatus is provided for simultaneously outputting audio signals contained in a multiplexed audio signal via a loudspeaker and a headphone. The audio signal apparatus comprises a first volume/balance adjuster for adjusting volume and balance of an audio signal output via the loudspeaker, and a second volume/balance adjuster for adjusting volume and balance of an audio signal output via the headphone. A switch provides a first audio signal included in the multiplexed audio signal to the first volume/balance adjuster and simultaneously provides a second audio signal included in the multiplexed audio signal to the second volume/balance adjuster. A microcomputer controls volume and balance adjustment operations of the first and second volume/balance adjusters and controls the operation of the switch.

5 Claims, 3 Drawing Sheets

AUDIO SIGNAL OUTPUT APPARATUS FOR SIMULTANEOUSLY OUTPUTTING A PLURALITY OF DIFFERENT AUDIO SIGNALS CONTAINED IN MULTIPLEXED AUDIO SIGNAL VIA LOUDSPEAKER AND HEADPHONE

BACKGROUND OF THE INVENTION

1. Field of the Invention

The present invention relates to an audio signal output apparatus for outputting audio signals contained in a multiplexed audio signal via a loudspeaker and a headphone.

2. Description of the Related Art

A conventional audio signal output apparatus supports a multiplexed audio signal. A stereophonic audio signal in which audio signals corresponding to different output directions are multiplexed, a multi-lingual audio signal in which audio signals covering multi-lingual languages are multiplexed, and a picture-in-picture audio signal in which an audio signal corresponding to a main picture and an audio signal corresponding to a sub-picture are multiplexed, belong to the multiplexed audio signal.

FIG. 1 is a block diagram showing a conventional audio signal output apparatus for outputting audio signals contained in a multiplexed audio signal via a loudspeaker and a headphone.

The audio signal output apparatus of FIG. 1 comprises an audio processor 1, an audio amplifier 3, a switch 5, a loudspeaker 7 and a headphone 9. The audio processor 1 demultiplexes an input multiplexed audio signal and then signal-processes each of the demultiplexed audio signals. The audio amplifier 3 amplifies audio signals from the audio processor 1 according to volume and balance control commands input by a user, and then outputs the amplified audio signals to the switch 5. The switch 5 outputs the audio signals output from the audio amplifier 3 to the loudspeaker 7 or the headphone 9 according to user's selection. Accordingly, the audio signal output apparatus of FIG. 1 can output the audio signals contained in the multiplexed audio signal via the loudspeaker 7 or the headphone 9 to produce audible sound.

However, since the audio signal output apparatus of FIG. 1 outputs the demultiplexed audio signals to only one of the loudspeaker 7 and the headphone 9, for example, the conventional audio signal output apparatus cannot perform the function of outputting an English language audio signal via the loudspeaker 7 while at the same time outputting a Korean language audio signal via the headphone 9.

In addition, when an audio signal is output via the loudspeaker 7 or when an audio signal is output via the headphone 9, the volume and balance control is performed by the audio amplifier 3. In general, since the volume and balance settings which are controlled with respect to the loudspeaker 7 are not appropriate for the headphone 9, the user should readjust the volume and balance in order to listen to a properly volume-adjusted and balanced audio signal whenever an audio signal output path is changed.

SUMMARY OF THE INVENTION

To solve the above problems, it is an object of the present invention to provide an audio signal output apparatus for simultaneously outputting different audio signals contained in a multiplexed audio signal via a loudspeaker and a headphone, and adjusting volume and balance with respect to the loudspeaker and the headphone to thereby use the adjusted result as a default value.

To accomplish the above object of the present invention, there is provided an audio signal output apparatus for simultaneously outputting different audio signals contained in a multiplexed audio signal via a loudspeaker and a headphone, the audio signal output apparatus comprising a first volume/balance adjuster for adjusting a volume and balance state with respect to the loudspeaker; a second volume/balance adjuster for adjusting a volume and balance state with respect to the headphone; a switching circuit for applying an audio signal among the plurality of the audio signals to the first volume/balance adjuster, and applying the other audio signal to the second volume/balance adjuster so that the different audio signals are simultaneously output via the loudspeaker and the headphone; and a microcomputer for controlling volume and balance adjustment operations of the first and second volume/balance adjusters and controlling the operation of the switching with circuit.

BRIEF DESCRIPTION OF THE DRAWINGS

The preferred embodiment is described with reference to the drawings wherein.

DETAILED DESCRIPTION OF THE PREFERRED EMBODIMENT

A preferred embodiment of the present invention will be described in detail with reference to the accompanying drawings.

In this embodiment, for convenience of explanation, audio signals input from an external input end 90 are obtained by demultiplexing a multiplexed audio signal.

Figure 1:
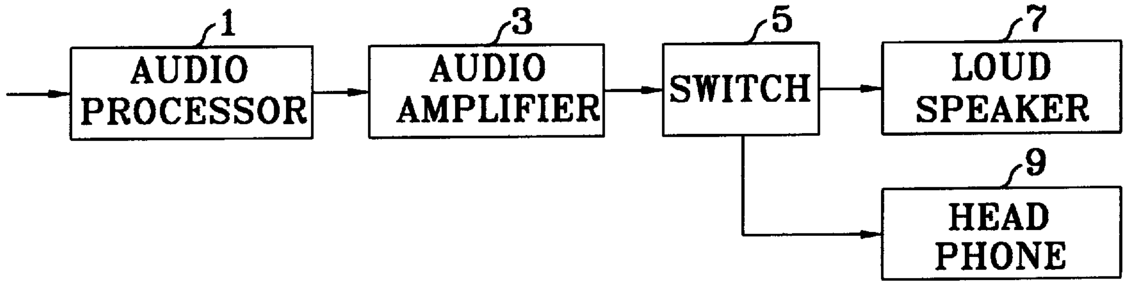
FIG. 1 is a block diagram showing a conventional audio signal output apparatus for outputting audio signals contained in a multiplexed audio signal via a loudspeaker and a headphone.
Figure 2:
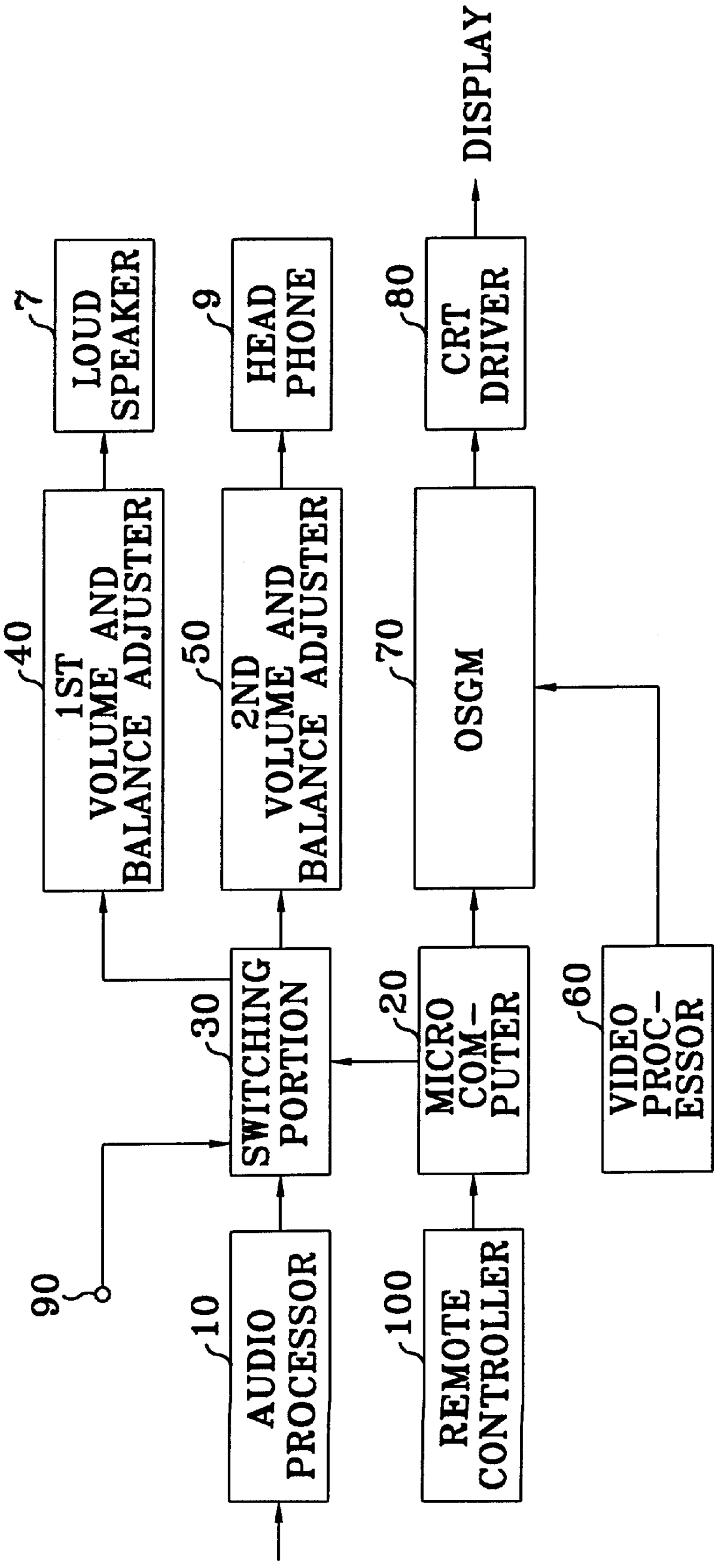
FIG. 2 is a block diagram showing an audio signal output apparatus for outputting audio signals contained in a multiplexed audio signal via a loudspeaker and a headphone according to a preferred embodiment of the present invention.

Referring to FIG. 2, an audio processor 10 demultiplexes a multiplexed audio signal input from a tuner (not shown), and processes the demultiplexed audio signal under the control of a microcomputer 20, to then output the processed signal to a switching portion 30. External audio signals input via the external input terminal 90 are supplied to the switching portion 30. The switching portion 30 provides selected audio signals of the demultiplexed audio signals output from the audio processor 10 and the external audio signals supplied via the external input terminal 90 to a first volume/balance adjuster 40 and a second volume/balance adjuster 50 under the control of the microcomputer 20. In more detail, one of the selected audio signals constituting two audio signals is applied to the first volume/balance adjuster 40 and the other is applied to the second volume/balance adjuster 50. The first volume/balance adjuster 40 adjusts the volume/balance of the audio signal input from the switching portion 30 under the control of the microcomputer 20, and then outputs the adjusted result to a loudspeaker 7. The second volume/balance adjuster 50 adjusts the volume and balance of the audio signal input from the switching portion 30 under the control of the microcomputer 20, and then outputs the adjusted result to a headphone 9. An on-screen graphic processor and mixer (OSGM) 70 superimposes an on-screen menu including a plurality of sub-menus on a video signal input from a video processor 60 and then outputs the mixed result to a cathode ray tube (CRT) driver 80. The CRT driver 80 displays visually the video signal output from the OSGM 70. The microcomputer 20 controls the operation of the respective constructional elements.

The operation of the audio signal output apparatus of FIG. 2 will be described below in more detail. For convenience of explanation, the multiplexed audio signal input from the tuner (not shown) is a multi-lingual signal multiplexed by an English language audio signal and a Korean language audio signal.

When a user's command that an English language audio signal is output via the loudspeaker 7 and at the same time a language audio signal is output via the headphone 9, is input via a remote controller 100, together with a command that an English audio signal is output as a monophonic sound and at the same time a Korean audio signal is output as a stereophonic sound. The microcomputer 20 controls the audio processor 10 and the switching portion 30 according to the user's command input via the remote controller 100. The audio processor 10 separates the received multiplexed audio signal into the language audio signal and the language audio signal, and then signal-processes the English audio signal as a monophonic sound and processes the Korean audio signal as a stereophonic sound. The switching portion 30 provides the audio signals from the audio processor 10 to the first volume/balance adjuster 40 and the second volume/balance adjuster 50 under the control of the microcomputer 20, respectively. In more detail, the switching portion 30 applies the monophonic language audio signal of the signals input from the audio processor 10 to the first volume/balance adjuster 40, and the stereophonic language audio signal thereof to the second volume/balance adjuster 50, under the control of the microcomputer 20.

Figure 3:
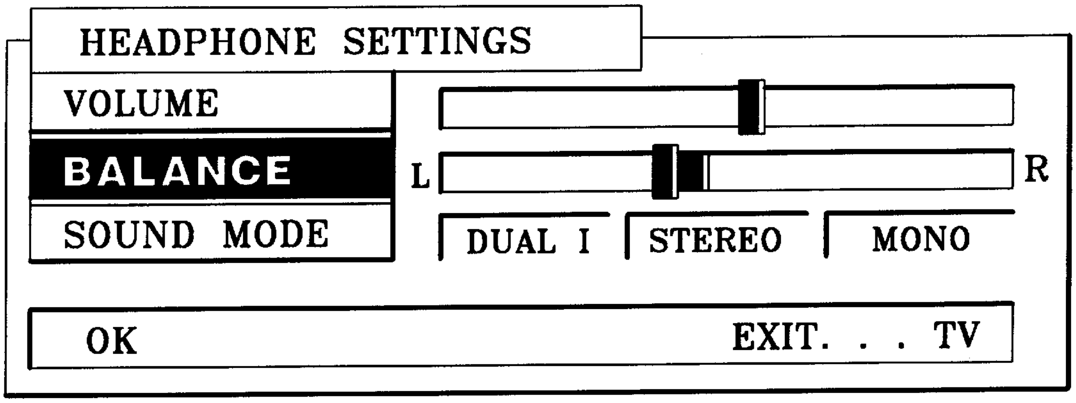
FIG. 3 is illustrates an on-screen menu.

When a user's command for adjusting the volume and balance of language audio signal output via the headphone 9 is input through the remote controller 100, the microcomputer 20 controls the OSGM 70. The OSGM 70 superimposes an on-screen menu at the predetermined position of the video signal input from the video processor 60. As a result, the on-screen menu as shown in FIG. 3 is visually displayed. After the volume and balance of the language audio signal is adjusted using the on-screen menu, the microcomputer 20 stores an adjustment value as a default value with respect to the headphone 9, and controls the second volume/balance adjuster 50 according to the adjustment value.

Further, when a user's command for adjusting the volume and balance of language audio signal output via the loudspeaker 7 is input through the remote controller 100, the microcomputer 20 controls the OSGM 70. The OSGM 70 superimposes an on-screen menu at the predetermined position of the video signal input from the video processor 60. As a result, the on-screen menu which is similar to one of FIG. 3 is visually displayed. After the volume and balance of the language audio signal is adjusted using the on-screen menu, the microcomputer 20 stores an adjustment value as a default value with respect to the loudspeaker 7, and controls the first volume/balance adjuster 40 according to the adjustment value.

Here, if no volume and balance adjustment command with respect to any one of the loudspeaker 7 and headphone 9 is input, respective stored default values with respect to the loudspeaker 7 or the headphone 9 are loaded by the microcomputer 20, a current state of the volume and balance with respect to the loudspeaker 7 and the headphone 9 is defined according to the loaded default values.

After the adjustments of the volume and balance with respect to the loudspeaker 7 and the headphone 9 are completed by the first volume/balance adjuster 40 and the second volume/balance adjuster 50, the first volume/balance adjuster 40 outputs the language audio signal whose volume and balance has been adjusted to the loudspeaker 7 and the second volume/balance adjuster 50 outputs the language audio signal whose volume and balance has been adjusted to the headphone 9.

As described above, the audio signal output apparatus of FIG. 2 including the microcomputer 20, the switching portion 30 and the volume/balance adjusters 40 and 50 outputs simultaneously a plurality of the different audio signals contained in the multiplexed audio signal via the loudspeaker 7 and the headphone 9. In addition, the volume and balance are individually adjusted with respect to the loudspeaker 7 and the headphone 9, and the adjusted result is stored as a default value. Thus, whenever the audio signal output path is altered, the volume and balance need not be readjusted.

While only a certain embodiment of the invention has been specifically described herein, it will be apparent that numerous modifications may be made thereto without departing from the spirit and scope of the invention.

What is claimed is:

1. An audio signal output apparatus for simultaneously outputting different audio signals contained in a multiplexed audio signal via a loudspeaker and a headphone, the audio signal output apparatus comprising:

a first volume and balance adjuster for adjusting a volume and balance state with respect to the loudspeaker;

a second volume and balance adjuster for adjusting a volume and balance state with respect to the headphone;

a switching circuit for providing a first audio signal included in the multiplexed audio signal to the first volume and balance adjuster, and applying a second audio signal included in the multiplexed audio signal to the second volume and balance adjuster so that the first and second audio signals are respectively output at the same time via the loudspeaker and the headphone; and a microcomputer for controlling volume and balance adjustment operations of the first and second volume and balance adjusters and controlling operation of the switching circuit.

2. The audio signal output apparatus according to claim 1, wherein said microcomputer individually controls the volume and balance adjustment operations of said first and second volume/balance adjusters.

3. The audio signal output apparatus according to claim 1, wherein said microcomputer stores respective resultant values of the volume and balance adjustments performed by said first and second volume/balance adjusters as default values, and applies the default values to said first and second volume/balance adjusters when the next volume and balance adjustment is performed.

4. The audio signal output apparatus according to claim 1, wherein said multiplexed audio signal is obtained by multiplexing an audio signal of a first language and the other audio signal of a second language.

5. The audio signal output apparatus according to claim 1, wherein said multiplexed audio signal is obtained by multiplexing an audio signal corresponding to a main picture of a picture-in-picture mode and another audio signal corresponding to a sub-picture.

* * * * *